(12) United States Patent
Kumagai et al.

(10) Patent No.: US 6,570,413 B1
(45) Date of Patent: May 27, 2003

(54) DRIVER CIRCUIT FOR SWITCHING DEVICE

(75) Inventors: Naoki Kumagai, Nagano (JP); Hiroyuki Kawakami, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 09/661,905

(22) Filed: Sep. 14, 2000

(30) Foreign Application Priority Data

Sep. 20, 1999 (JP) .......................................... 11-265856

(51) Int. Cl.⁷ ................................................ H03B 1/00
(52) U.S. Cl. ...................................... 327/108; 327/112
(58) Field of Search ................................ 327/380, 381, 327/384, 111, 112, 108, 109

(56) References Cited

U.S. PATENT DOCUMENTS

| | | | | |
|---|---|---|---|---|
| 5,852,549 A | * | 12/1998 | Heeringa | 363/18 |
| 5,949,259 A | * | 9/1999 | Garcia | 327/111 |
| 6,054,890 A | * | 4/2000 | Giacomo | 327/375 |
| 6,181,186 B1 | * | 1/2001 | Itoh et al. | 327/309 |
| 6,208,125 B1 | * | 3/2001 | Allee | 323/312 |
| 6,208,177 B1 | * | 3/2001 | Knoedl, Jr. | 327/108 |

* cited by examiner

*Primary Examiner*—Timothy P. Callahan
*Assistant Examiner*—Linh Nguyen
(74) *Attorney, Agent, or Firm*—Kanesaka & Takeuchi

(57) ABSTRACT

A drive circuit drives a voltage-controlled semiconductor switching device with a control terminal. The drive circuit includes a device for supplying a current to the control terminal based on an input of an ON signal, and a device for removing a current from the control terminal of the voltage-controlled semiconductor switching device based on an input of an OFF signal. The current-supplying device includes a voltage-controlled transistor having a gate electrode and a drain electrode connected to the control terminal, and a capacitor connected between the gate and drain electrodes of the voltage-controlled transistor. It is possible to reduce turn-on losses during the turn-on time of the switching device while reducing noises generated thereat.

9 Claims, 8 Drawing Sheets

US 6,570,413 B1

DRIVER CIRCUIT FOR SWITCHING DEVICE

BACKGROUND OF THE INVENTION AND RELATED ART STATEMENT

The present invention relates to a drive circuit for a voltage-controlled switching device, such as insulated-gate bipolar transistor (IGBT), which is used in a power-conversion device, particularly in an inverter for motor speed control, that is, a circuit for accepting external ON/OFF signals as inputs to generate and apply signals for ON/OFF drive directly applied to a control terminal of the voltage-controlled semiconductor switching device. In particular, the invention relates to a drive circuit having a function of minimizing a turn-on time, power dissipation and noise generation in a driven voltage-controlled semiconductor switching element.

In the figures showing below, the same reference signs denote identical or equivalent parts.

FIG. 4 shows an example of a structure of the conventional simplest drive circuit for driving a power switching device, in this case IGBT 1. In this embodiment, means for charging and turning on the IGBT 1 is a P-channel MOSFET 2, and means for turning off the IGBT 1 is an N-channel MOSFET 4.

If an ON signal is input to an ON/OFF-signal input terminal 8, a predriver 7 first provides an output 7b with a low potential (hereinafter also referred to as "L") to turn off the N-channel MOSFET 4, and then provides an output 7a with "L" to turn on the P-channel MOSFET 2. When the MOSFET 2 is turned on, it charges the gate capacitance of the IGBT 1 to turn the IGBT 1 ON. This difference in time between the changes in the outputs 7b and 7a is provided in order to prevent a short-circuit current from flowing when both MOSFETs 2 and 4 are simultaneously turned on due to MOSFET gate delay.

On the other hand, if an OFF signal is input to the ON/OFF-signal input terminal 8, the predriver 7 first provides the output 7a with a high potential (hereinafter also referred to as "H") to turn off the P-channel MOSFET 2, and then provides the output 7b with "H" to turn on the N-channel MOSFET 4. Thus, the IGBT 1 gate capacitance is discharged and the IGBT 1 is turned OFF.

In driving the power switching devices, such as IGBTs or MOSFETs, it is important to reduce overall losses including steady-state losses caused by an ON voltage, and switching losses, i.e. turn-on and turn-off losses. If, however, the switching speed is increased to reduce the switching losses, rapid dV/dt or di/dt may cause noise. This noise is normally large when the power switching device is turned on.

In recent years, a great effort has been made in developing drive methods that solve this problem in order to reduce both switching losses and noise. Such drive methods are disclosed in Japanese Patent Application Laid Open (KOKAI) Nos. 61-237513 and 7-240676, wherein a capacitor is connected between the gate and drain of a field-effect transistor (FET) to reduce the ON/OFF speed.

FIG. 5 shows an inverter circuit that uses a pulse-width modulation (PWM) for a motor speed control. The circuit has been simplified to facilitate explanation of the operation of a semiconductor switching device. FIG. 6 shows the turn-on waveforms of the IGBT 1 in this circuit. An operation is described with reference to FIGS. 5 and 6.

First, when the IGBT 1 is turned on, a current flows through a load inductance L. The current increases in terms of di/dt (=Ed/L) determined by the inductance L and a power-supply voltage Ed (specifically, Ed−(ON voltage of the IGBT 1)=voltage applied to the inductance L).

Next, the IGBT 1 is turned off when a fixed current is reached, and the current flow is commuted through a free-wheeling diode 31 (transition from I0 to I1 in FIG. 5).

Next, when the IGBT 1 is turned on again, all currents flowing through the free-wheeling diode 31 shift to the IGBT 1 at the time that the current through the IGBT 1 has increased to the value of the current through the inductance L (I1 in FIG. 5: in fact, this current is slightly less provided by an ON voltage at the free-wheeling diode 31 or the like, but this attenuation is weak since the inductance L is sufficiently large).

FIG. 6 shows the waveforms of a gate voltage $V_{GE}$, a collector current Ic, and a collector-emitter voltage $V_{CE}$ observed when the IGBT 1 is turned on under the conditions noted above.

The IGBT 1 is assumed to be driven by the drive circuit in FIG. 4, in which the P-channel MOSFET 2 is turned on at time t1 to start to provide a source current to the gate of the IGBT 1. When the IGBT gate voltage $V_{GE}$ reaches the gate threshold value at time t2, collector current Ic starts flowing and increases with the increase of the gate voltage.

When the collector current Ic comes to equal to the forward current through the free-wheeling diode 31 at time t3, current no longer flows from the inductance L to the IGBT 1, because the inductance L is sufficiently large to thereby suppress rapid increase in current flowing through the inductance L.

However, even when no current is flowing through the free-wheeling diode 31, excess carriers that have been generated by the conductivity modulation while current is flowing remain. If the gate voltage of the IGBT 1 is sufficient to allow a higher collector current Ic to flow, a current (hereinafter referred to as a "reverse recovery current") I2 flows transitionally in a direction opposite to a direction where the current was previously flowing through the free-wheeling diode 31.

This reverse recovery current I2 flows through the IGBT 1 as shown in FIG. 5 such that a current flowing through the IGBT 1 is expressed by I1 (=I0)+I2. The gate voltage $V_{GE}$ of the IGBT 1 attempts to rise continuously due to a charging current from the P-channel MOSFET 2, but falls steadily along with the collector-emitter voltage $V_{CE}$ of the IGBT 1. This is due to the fact that this voltage drop causes current to flow through a collector-gate capacitance of the IGBT 1 (what is known as the "Miller effect").

The reason that the collector-emitter voltage $V_{CE}$ of the IGBT 1 starts to decline (t4) after the reverse recovery current I2 starts to flow through the free-wheeling diode 31 (t3) is now explained. In an area in which the free-wheeling diode 31 can supply a current appropriate for the gate voltage of the IGBT 1 based on a diffusion current associated with a change in an internal carrier distribution, a depletion layer need not extend and the voltage at the free-wheeling diode 31 does not rise, thereby preventing a decrease in the collector-emitter voltage $V_{CE}$ of the IGBT 1.

In an area in which a current can not be supplied unless the reverse recovery current continues to flow through the free-wheeling diode 31 to extend the depletion layer, the reverse recovery current flowing through the free-wheeling diode 31 increases and the collector-emitter voltage $V_{CE}$ of the IGBT 1 starts to decrease. Thus, due to the Miller effect, the gate voltage $V_{GE}$ of the IGBT 1 falls, and the collector current Ic flowing through the IGBT 1 takes a peak value near time t4 and subsequently falls to the value of the current Ii previously flowing through the free-wheeling diode 31. Subsequently, between time t5 and t6, the gate voltage $V_{GE}$ remains at or near the value at which the IGBT 1 can maintain the current previously flowing through the free-wheeling diode 31.

On the other hand, the collector-emitter voltage $V_{CE}$ decreases consistently with dV/dt, as shown in FIG. 6. This is due to the fact that, as the $V_{CE}$ diminishes, the current flowing through the collector-gate capacitance of IGBT 1 is balanced by the charging current from the P-channel MOSFET 2 so that they are equal. This also corresponds to a decrease in the collector-emitter voltage $V_{CE}$, which narrows the depletion layer in IGBT 1 and so increases the collector-gate capacitance of the IGBT 1.

In FIG. 6, after time t5, the collector current Ic remains constant after the gate voltage $V_{GE}$ becomes constant. In fact, the collector current increases in terms of di/dt determined from the inductance L and a voltage applied thereto, but may be considered to be substantially constant on the time scale shown in this figure, due to the sufficiently large inductance L.

As described above, a current greater than that flowing through the inductance L between time t3 and t5 flows through the IGBT 1. The portion of this current that exceeds the current previously flowing through the inductance L (this portion corresponds to the reverse recovery current flowing through the free-wheeling diode) causes losses in the free-wheeling diode 31 and increases losses in the IGBT 1.

Furthermore, if the reverse recovery current decreases rapidly, a voltage equal to Ls·di/dt may occur due to the floating inductance Ls shown in FIG. 5, to apply an excessively large voltage to the free-wheeling diode 31 and an IGBT 35 connected in parallel thereto, thereby destroying the device or causing an improper ignition in the IGBT 35. Even in the absence of such a phenomenon, the collector current Ic may vibrate as shown in FIG. 6, thereby increasing a radiated noise.

Next, conventional methods for reducing a turn-on delay and losses in the IGBT 1, and for restraining errors, such as noise, will be described.

FIG. 7 shows an example of a conventional drive circuit that is intended to achieve the above purpose and differs from FIG. 4 in that it has P-channel MOSFETs 36 and 37 connected thereto instead of the P-channel MOSFET 2, and in that the gate of the P-channel MOSFET 36 is not driven directly by the predriver 7, but by a pulse circuit 38.

FIG. 8 is a timing chart useful for explaining the operation of the circuit shown in FIG. 7. When an ON signal is input to the ON/OFF-signal input terminal 8 (port A) of the predriver 7, the predriver 7 first provides the output 7b (that is, the potential at the gate (point D) of the MOSFET 4) with "L" to shut down the MOSFET 4. Next, following a delay td1, the predriver 7 provides the output 7a (that is, the potential at a gate of the MOSFET 37 and an input (point B) of the pulse circuit 38) with "L" to turn the MOSFET 37 on. The predriver 7 also switches the potential at a gate (point C) of the MOSFET 36 in such a manner that the output 7a is kept "L" for the period td2, and then "H" for the period td3, and is further switched back to "L" via the pulse circuit 38.

The period td2 corresponds to the period between time t1 and t2 shown in FIG. 6, and the period td3 corresponds to the period between time t2 and t4 shown in FIG. 6. That is, the gate of the IGBT 1 is charged only by the MOSFET 37 during the period between time t2 and t4 (period td3), whereas it is charged by the MOSFETs 36 and 37 during the period between time ti and t2 (period td2) and on and after time t4 (following the period td3). This provides the following effects:

First, due to the use of the MOSFETs 36 and 37 for charging between time t1 and t2, the amount of time required from the input of the ON signal until the gate voltage $V_{GE}$ of the IGBT 1 reaches a threshold value (this amount of time corresponds to the turn-on delay time) can be reduced. This does not reduce switching losses in the IGBT 1, but reduces the delay time before the actual turn-on of the IGBT 1 (start of conduction) to improve control ability.

Next, since the gate of the IGBT 1 is charged only by the MOSFET 37 between time t2 and t4, the di/dt of the collector current flowing through the IGBT 1 decreases to slightly increase the switching losses in the IGBT 1 during the period between time t2 and t3. Since, however, the overshoot of the gate voltage $V_{GE}$ (peak of the gate voltage $V_{GE}$ between time t3 and t1 shown in FIG. 6) declines to reduce the peak value of the collector current IC while restraining rapid increases in Ic. This, in turn, prevents the voltage surge caused by the floating inductance Ls and radiation noise arising from the current vibration.

On and after time t4, the MOSFETs 36 and 37 are used for charging again, so that the Miller effect reduces the period during which the gate voltage of the IGBT 1 is constant (period between time t5 and t6 shown in FIG. 6), thereby facilitating the decrease in the collector-emitter voltage $V_{CE}$ of the IGBT 1 to lessen the turn-on losses during this period.

Thus, in the IGBT 1 of the circuit shown in FIG. 7, the turn-on losses increase during time t2 and t3 shown in FIG. 6, but can be reduced during the period between time t5 and t6, thereby restraining the voltage surge and noise without increasing switching losses (in this case, turn-on losses).

The period td4 shown in FIG. 8 is formed to prevent simultaneous turn-on of the MOSFET 36 or 37 and the MOSFET 4, as in the period td1.

In a practical inverter circuit for a motor control, pulse-width modulation is used to control an output current from the inverter circuit so as to create a sine waveform. As a result, the current flowing through the IGBT 1 is not constant. Accordingly, the duration of the period between time t2 and t3 shown in FIG. 6 is not constant. Thus, the period during which the MOSFET 36 shown in FIG. 7 is turned off while the MOSFET 37 remains on (this corresponds to the period td3 shown in FIG. 8) must be sufficiently long to accommodate the maximum current.

Thus, in fact, the current for charging the gate capacitance of the IGBT 1 remains low just after time t5 shown in FIG. 6, in which the charging current must be high, and as a result, switching losses can not be sufficiently reduced during the period between time t5 and t6. This circuit has another disadvantage in that an appropriate control can not be provided if the time t1 or t2 shown in FIG. 6 varies due to its temperature characteristics or the like.

Next, a situation will be discussed in which the IGBT 1 is turned on if a load on the IGBT 1 is short-circuited. FIG. 9 shows waveforms of the current and voltage observed when the IGBT 1, which was off, is turned on by short-circuiting the load. Charging of the gate capacitance of the IGBT 1 begins at time t11, and when the gate voltage $V_{GE}$ reaches the gate threshold value at time t12, a current starts to flow through the IGBT 1.

During a load short circuit, if the effects of the floating inductance of wiring or the like are neglected, the voltage applied to the IGBT 1 will be constant. Accordingly, the Miller effect associated with the decrease in the collector voltage $V_{CE}$ of the IGBT 1 shown in FIG. 6 prevents the gate voltage $V_{GE}$ of the IGBT 1 from remaining constant. As a result, the gate voltage $V_{GE}$ continues to rise and reaches a voltage value $V_{CC}$ of a power supply 11 for a driving circuit at time t13.

During the short circuit, however, carriers within the IGBT 1 cause a current to flow from the gate of the IGBT 1 toward the drive circuit, and the impedance of the driving circuit and the inductance of the gate wiring cause a voltage drop, thereby increasing the gate voltage $V_{GE}$ to the same level as, or higher than, the supply voltage $V_{CC}$ of the driving circuit. This phenomenon is significant if a gate resistor (connected between the gate of the IGBT 1 and the drain of the MOSFET 2, not shown in FIG. 4) is provided. Then, following a transition period, the gate voltage $V_{GE}$ reaches a maximum value at time t14, and then returns to the supply voltage $V_{CC}$ at time t15.

On the other hand, the collector current Ic increases along with the gate voltage $V_{GE}$, and then decreases in proportion to the gate voltage $V_{GE}$ after the latter peaks at time t14. It is due to an increase in the temperature of the IGBT 1 that the collector current Ic falls, even after the gate voltage $V_{GE}$ has reached a constant value.

Recent IGBTs have improved in performances due to their reduced ON voltage or the like, but the IGBTs with higher performances have a higher collector current during a load short circuit and are thus more likely to be destroyed in a short period of time. Thus, current-limiting circuits are commonly used to detect a load short circuit to restrain increases in gate voltage.

If, however, the gate voltage and collector current increase at a high rate, destruction may occur before the current-limiting circuit is activated. If, in the circuit shown in FIG. 4, the normal switching speed of the IGBT 1 is not reduced, since the ON resistance of the MOSFET 2 can not be augmented, the collector current of the IGBT 1 increases at a higher speed to hinder a circuit protection.

In the circuit shown in FIG. 7, the increase in speed is controlled in the initial stage of the increase in the collector current, but the gate of the IGBT 1 is rapidly charged after a fixed period of time. The current level at which a short-circuit current is detected is higher than the normal current level, so that in the circuit shown in FIG. 7, the increase in current from the detection of a load short circuit until the protection circuit starts to operate is greater than that in the circuit shown in FIG. 4. Consequently, a short-circuit protection in this circuit is more difficult than in the circuit shown in FIG. 4.

It is an object of the present invention to provide a drive circuit that solves the problems with the above-described conventional drive circuits.

It is another object of the invention to provide a drive circuit that can reduce turn-on delays and losses while restraining possible noise during a turn-on period of a voltage-controlled semiconductor switching device to be driven.

It is a further object of the invention to provide a drive circuit that can be easily protected during the turn-on period in a load short-circuit state.

SUMMARY OF THE INVENTION

To attain the above objects, according to the first aspect of the invention, a drive circuit comprises means for supplying a current to a control terminal (gate or the like) of a voltage-controlled semiconductor switching device to be driven (IGBT 1, sensing IGBT 2, or the like) based on the input of an ON signal (to an ON/OFF-signal input terminal 8 of a predriver 9), and means (N-channel MOSFET 4 or the like) for removing a current from the control terminal of the voltage-controlled semiconductor switching device based on the input of an OFF signal (to the ON/OFF-signal input terminal 8). The current-supplying means has a voltage-controlled transistor (P-channel MOSFET 2 or the like) having its drain connected to the control terminal, and a capacitor (10) connected between the gate and drain of the voltage-controlled transistor.

According to a drive circuit in the second aspect, in the drive circuit according to the first aspect, the current-supplying means has a slow-charging means for relatively slowly charging the gate of the voltage-controlled transistor based on the input of the ON signal.

According to a drive circuit in the third aspect, in the drive circuit according to the second aspect, the slow-charging means comprises a semiconductor switching device (N-channel MOSFET 5) and a resistor (6) connected in series therewith.

According to a drive circuit in the fourth aspect, in the drive circuit according to the second aspect, the slow-charging means comprises a semiconductor switching device (N-channel MOSFET 12) having a low current conductance capacity (small channel width/channel length, and a high ON resistance).

According to a drive circuit in the fifth aspect, in the drive circuit according to the second aspect, the slow-charging means is a constant-current source.

According to a drive circuit in the sixth aspect, in the drive circuit according to any one of the first to fifth aspects, the current-supplying means further includes means (gate voltage detecting circuit 13 and P-channel MOSFET 14) for rapidly charging the control terminal of the voltage-controlled semiconductor switching device during the period between the input of the ON signal and the start of the flow of a current through the voltage-controlled semiconductor switching device to be driven (at time t2).

According to a drive circuit in the seventh aspect, in the drive circuit according to any one of the first to fifth aspects, the current-supplying means further includes means for detecting a commutation completion point (t3) when all currents flowing through a free-wheeling diode (31) connected in series with the voltage-controlled semiconductor switching device to be driven has been commuted to the voltage-controlled semiconductor switching device, and means (control circuit 17, P-channel MOSFET 14) for rapidly charging the control terminal of the voltage-controlled semiconductor switching device during the period between the input of the ON signal and the commutation completion point.

According to a drive circuit in the eighth aspect, in the drive circuit according to the seventh aspect, the means for detecting the commutation completion point has means (sample-and-hold circuit 15) for sampling and holding the last current flowing through the voltage-controlled semiconductor switching device, and current-comparison means (comparator 16) for comparing the sampled and held current value with the present current flowing through the voltage-controlled semiconductor switching device.

According to a drive circuit in the ninth aspect, in the drive circuit according to the eighth aspect, the current comparison means adds a predetermined offset (19) to the compared current value to enable earlier detection of the commutation completion point.

The operation of the present invention will be described below. A capacitor is inserted between the gate and drain of the MOSFET used to charge the control terminal of the semiconductor switching device to be driven (which will be referred to as a "main power device" hereinafter for the sake of convenience) to turn on the device, so that a larger Miller effect can be obtained if the drain voltage of the MOSFET for charging the control terminal, that is, the voltage at the control terminal of the main power device, varies during the turn-on period of the main power device.

Consequently, in an area in which the voltage at the control terminal of the main power device rises (or falls) rapidly, the ON resistance of the control-terminal-charging MOSFET decreases at a reduced (or increased) speed. The speed at which the voltage at the control terminal of the main power device varies, and thus di/dt of a current flowing through the main power supply between time t2 and t5 shown in FIG. 6 and dV/dt measured at the beginning of a decline in the collector-emitter voltage, are maintained at small values to restrain a current peak and thus noise. Furthermore, the speed at which the current increases is reduced during the turn-on period if a load on the main power device is short circuited, thereby allowing the protection circuit to protect the main power device easily.

On the contrary, in an area in which the voltage at the control terminal of the main power device varies slowly, the Miller effect does not operate and the ON resistance of the control-terminal-charging MOSFET falls at an increased rate to shorten the period between time t5 and t6 shown in FIG. 6, in order to lessen the losses during the latter half of the turn-on period (first aspect).

In addition, means for relatively slowly charging the gate of the control-terminal-charging MOSFET is provided to improve the effect of reducing the di/dt and dV/dt of the main power device (second to fifth aspects).

To prevent a delay at the time of turn-on when the above-described method is used, the means is separately provided for rapidly charging the control terminal of the main power device during the period between the input of the ON signal and the start of the flow of current through the main power device (sixth aspect).

Additionally, to enable the above-described method to be used to prevent the former half (period between time t2 and t3 shown in FIG. 6) of the turn-on period from extending to increase losses during this period, the means is separately provided for rapidly charging the control terminal of the main power device during the period between the input of the ON signal and time t3 shown in FIG. 6 (commutation completion time) when all currents flowing through the free-wheeling diode connected in series with the main power device have been commuted to the main power device (seventh aspect).

The means for sampling and holding the last current flowing through the main power device and the current-comparison means for comparing the sampled and held current value with the present current flowing through the voltage-controlled semiconductor switching device are provided as means for detecting the commutation completion time (eighth aspect).

The offset is added to the current-comparison means to prevent a delay in completion of the rapid charging of the control terminal of the main power device, based on the means for detecting the commutation completion time or other means (ninth aspect).

DETAILED DESCRIPTION OF PREFERRED EMBODIMENTS

Figure 1:
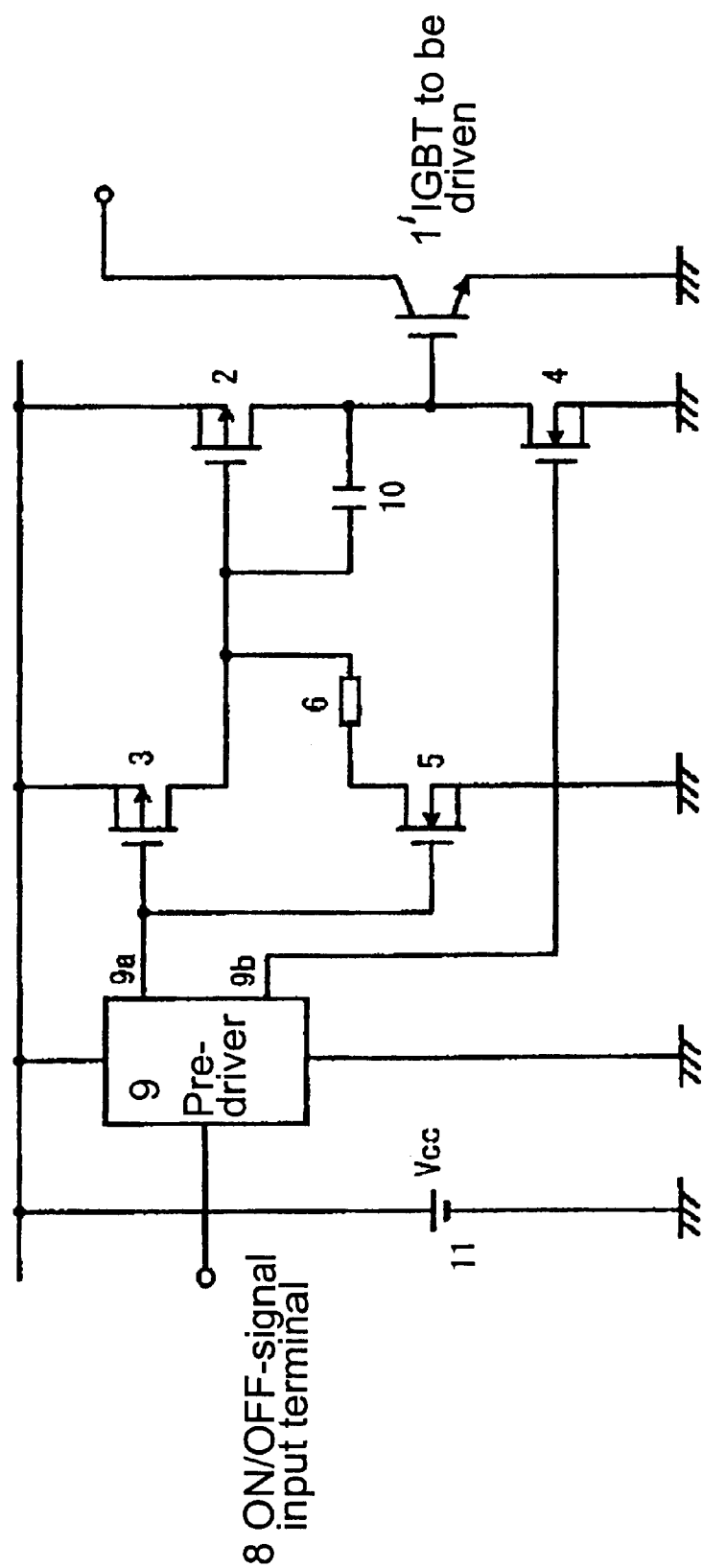
FIG. 1 is a configuration diagram of a drive circuit as a first embodiment of the present invention.
Figure 4:
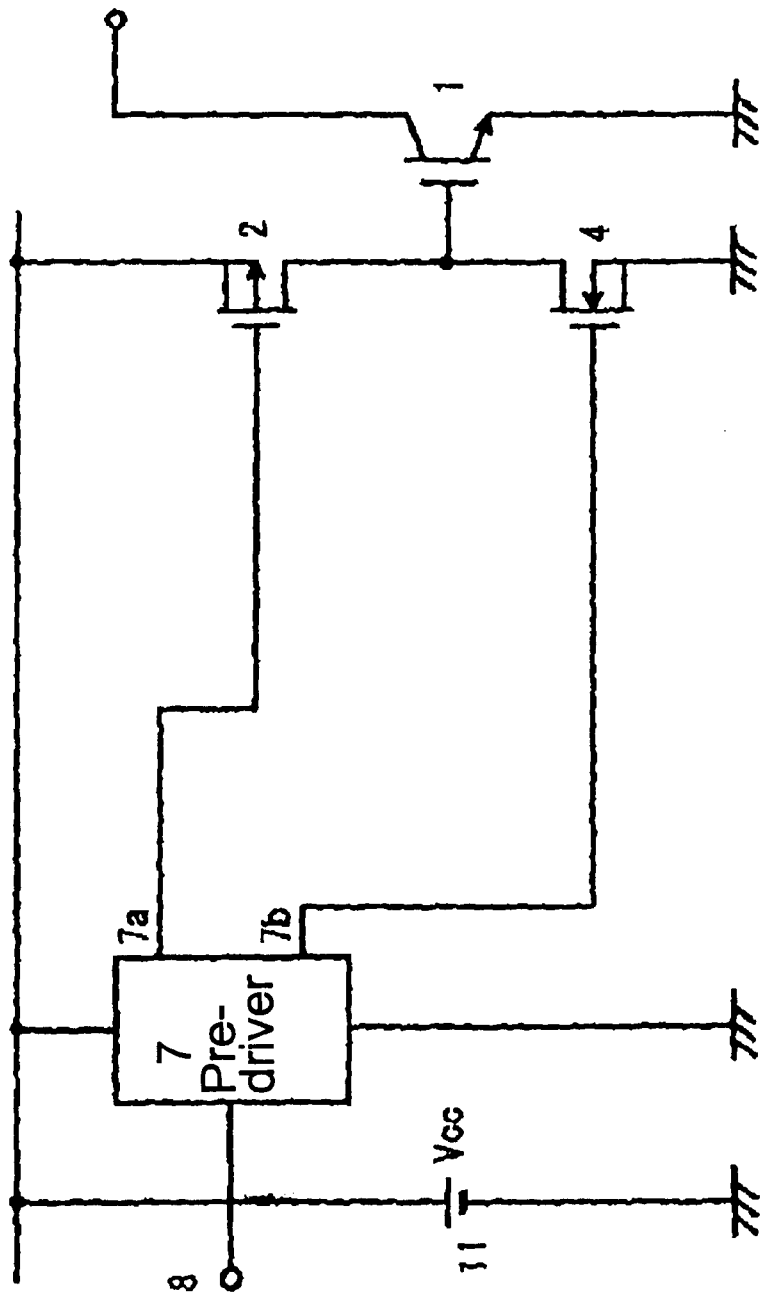
FIG. 4 is a configuration diagram showing an example of a conventional drive circuit.

FIG. 1 is a circuit diagram that shows the first embodiment of the present invention and differs from FIG. 4 in that a capacitor 10 is connected between the gate and drain of the MOSFET 2, in that instead of the predriver 7, a predriver 9 is provided that has an output 9a having a signal logically opposite to that of the output 7a of the predriver 7, and in that MOSFETs 3 and 5 and a resistor 6 are provided between the output end 9a of the predriver 9 and the gate of the MOSFET 2 for driving the MOSFET 2.

Figure 5:
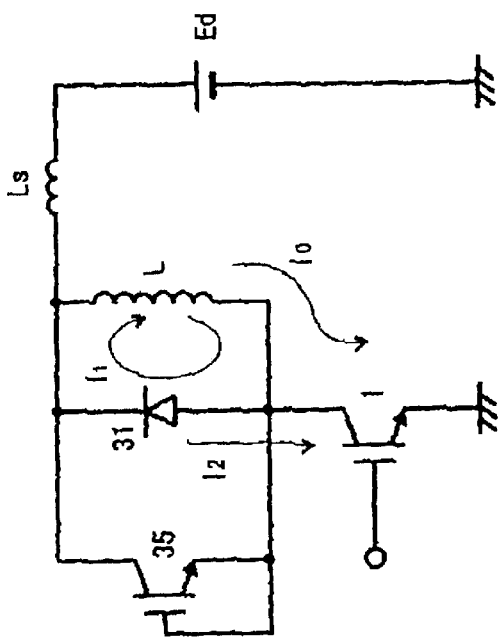
FIG. 5 is a conventional circuit diagram useful in explaining a switching operation performed by an IGBT.

Next, by replacing the IGBT 1' shown in FIG. 1 with the IGBT 1 used to describe FIGS. 5 and 6, the operation of the circuit shown in FIG. 1 will be explained with reference to FIGS. 5 and 6.

When an ON signal is applied to the ON/OFF input terminal 8, the predriver 9 first provides the output 9b with "L" to turn off the MOSFET 4, and then drives the output 9a to "H" to turn off the MOSFET 3 while turning on the MOSFET 5, in order to turn on the MOSFET 2.

When the MOSFET 5 is turned on, a current flows from the gate of the MOSFET 2 through the resistor 6 to reduce the gate potential of the MOSFET 2, and that causes the MOSFET 2 to be turned on, thereby raising the gate potential of the IGBT 1.

Figure 6:
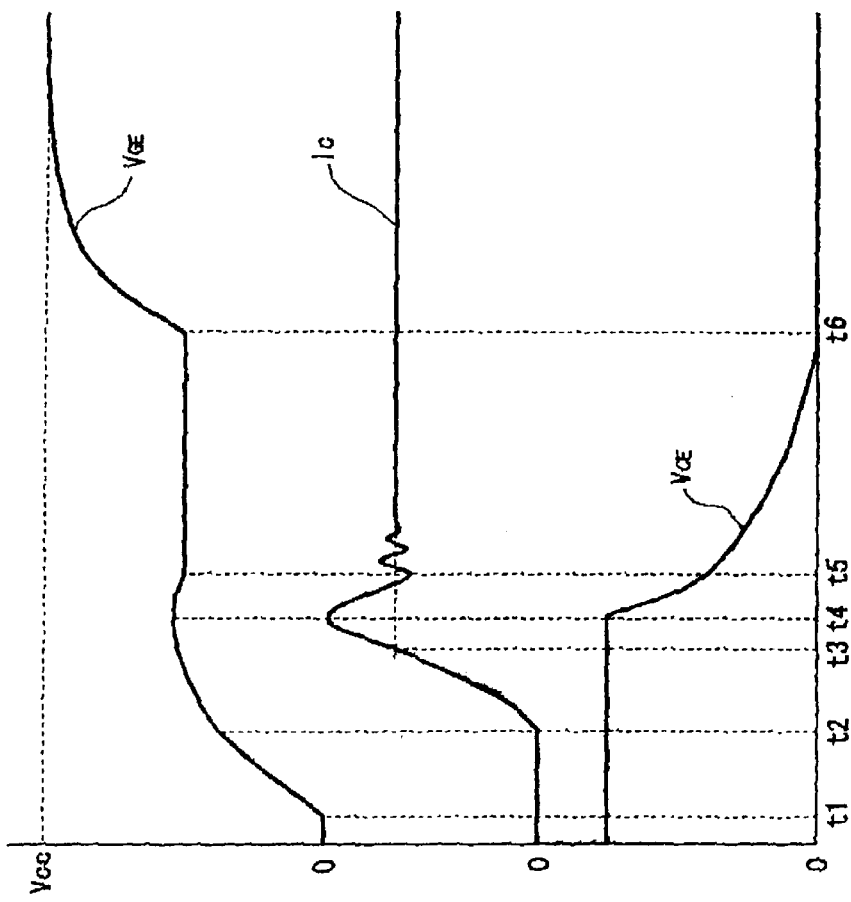
FIG. 6 is a waveform diagram that shows voltage and current waveforms and is useful in explaining the switching operation performed by the IGBT.

During the period between time t1 and t4 shown in FIG. 6, the gate voltage $V_{GE}$ of the IGBT 1 rises to allow a current to flow from the drain to the gate of the MOSFET 2 through the capacitor 10. Thus, the gate potential of the MOSFET 2 falls slowly.

Figure 7:
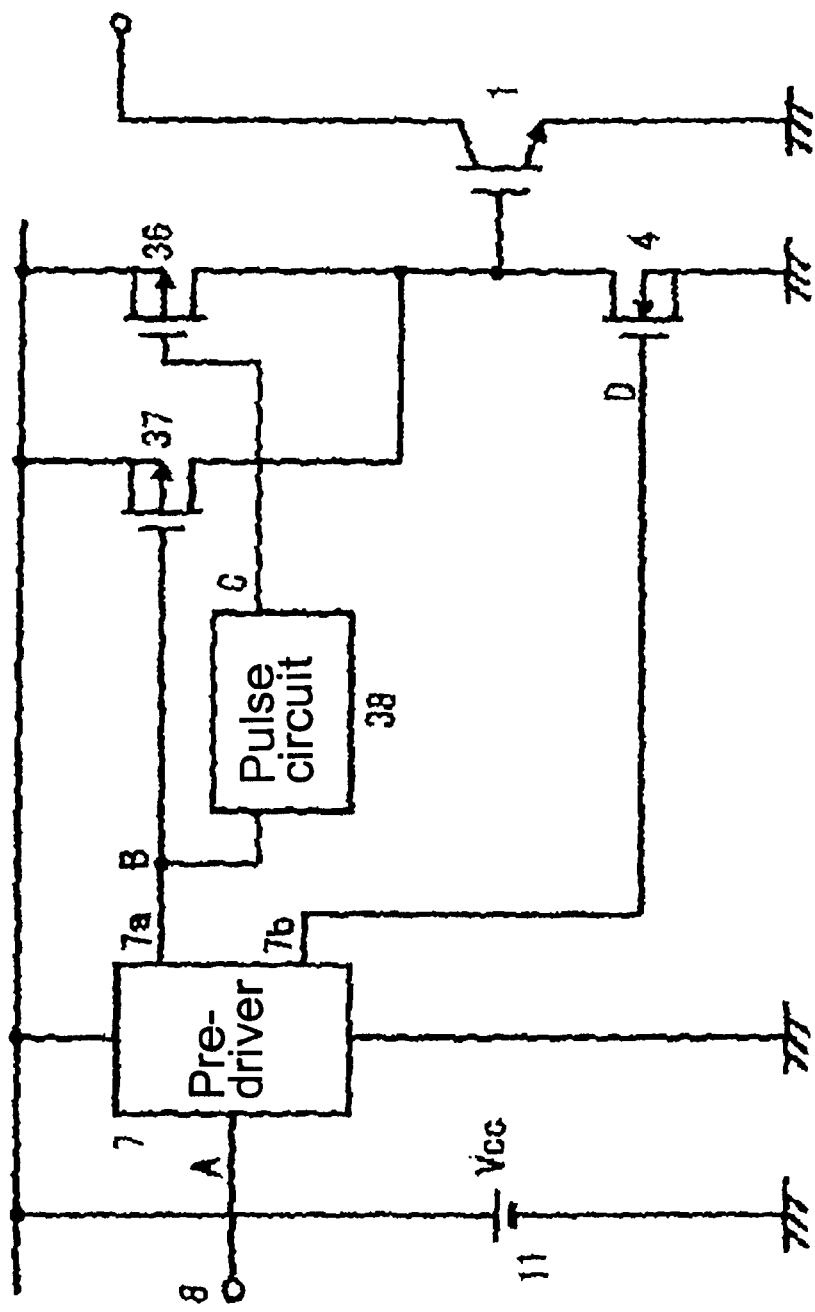
FIG. 7 is a configuration diagram showing another example of a conventional drive circuit.

Accordingly, the ON resistance of the MOSFET 2 falls slowly, while the gate voltage $V_{GE}$ of the IGBT 1 rises slowly. Compared to the circuit shown in FIG. 7, the speed at which the gate voltage $V_{GE}$ of the IGBT 1 rises also decreases during the period between time t1 and t2 shown in FIG. 6, but this circuit has effects similar to those of the circuit shown in FIG. 7, in that the speed at which the gate voltage $V_{GE}$ of the IGBT 1 rises is reduced during the period between time t2 and t4 shown in FIG. 6.

Figure 8:
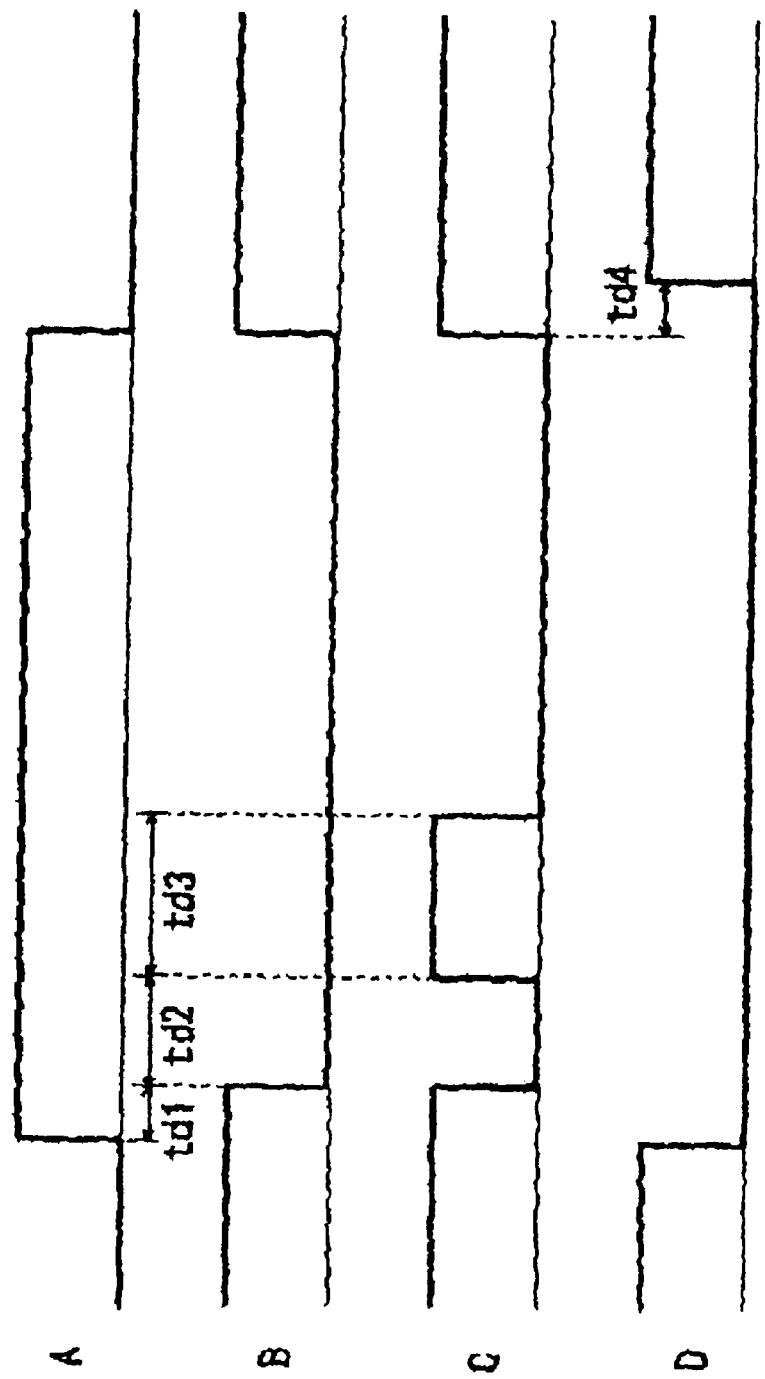
FIG. 8 is a diagram useful in explaining the operation of the drive circuit shown in FIG. 7.

The extended period between time t1 and t2 shown in FIG. 6 has the disadvantage of increasing the turn-on delay time as described above. This extension, however, does not affect switching losses and thus creates only a minor problem. In addition, the circuit shown in FIG. 1 allows the period td1 shown in FIG. 8 to be eliminated, that is, allows the outputs 9a and 9b of the predriver 9 to be simultaneously operated, and thus does not cause a significant problem.

Next, during the period between time t4 and t5 shown in FIG. 6, the gate voltage $V_{GE}$ of the IGBT 1, that is, the dV/dt of the drain potential of the MOSFET 2, becomes negative to allow a current to flow from the gate to the drain of the MOSFET 2 through the capacitor 10. Thus, the decrease in the gate potential of the IGBT 1 is suppressed, while the gate potential of the MOSFET 2 further declines. Thus, the ON resistance of the MOSFET 2 falls slightly to prevent the gate voltage $V_{GE}$ of the IGBT 1 from declining rapidly after passing the peak.

Since the gate voltage $V_{GE}$ of the IGBT 1 rises and falls slowly as described above, the peak value of the collector current Ic of the IGBT 1 is controlled to suppress the rapid decrease in Ic after the peak, thereby significantly restraining the voltage surge caused by the floating inductance Ls and noise.

Next, during the period after time t5 shown in FIG. 6, at which the gate voltage $V_{GE}$ of the IGBT 1 remains constant, the drain voltage of the MOSFET 2 does not vary, so that the "Miller effect" is eliminated to rapidly diminish the gate potential of the MOSFET 2. Consequently, the ON resistance of the MOSFET 2 falls rapidly to shorten the period between time t5 and t6 shown in FIG. 6 in order to reduce switching losses.

Furthermore, near the time t5 shown in FIG. 6, the ON resistance of the MOSFET 2 is still insufficiently low and declines gradually, thereby improving the characteristic that the collector-emitter voltage $V_{CE}$ of the IGBT 1 shown in FIG. 6 initially falls rapidly, and that the speed at which the voltage $V_{CE}$ declines then decreases gradually. As a result, the voltage $V_{CE}$ falls in accordance with the relatively constant dV/dt. In this way, the dV/dt of the collector-emitter voltage $V_{CE}$ of the IGBT 1 is expected to reduce noise.

The MOSFET 3 must be designed to be capable of charging the gate of the MOSFET 2 sufficiently rapidly to prevent the MOSFETs 2 and 4 from being simultaneously turned on due to a delay in the turn-on of the MOSFET 2 after the OFF signal has been applied to the ON/OFF input terminal 8.

Figure 9:
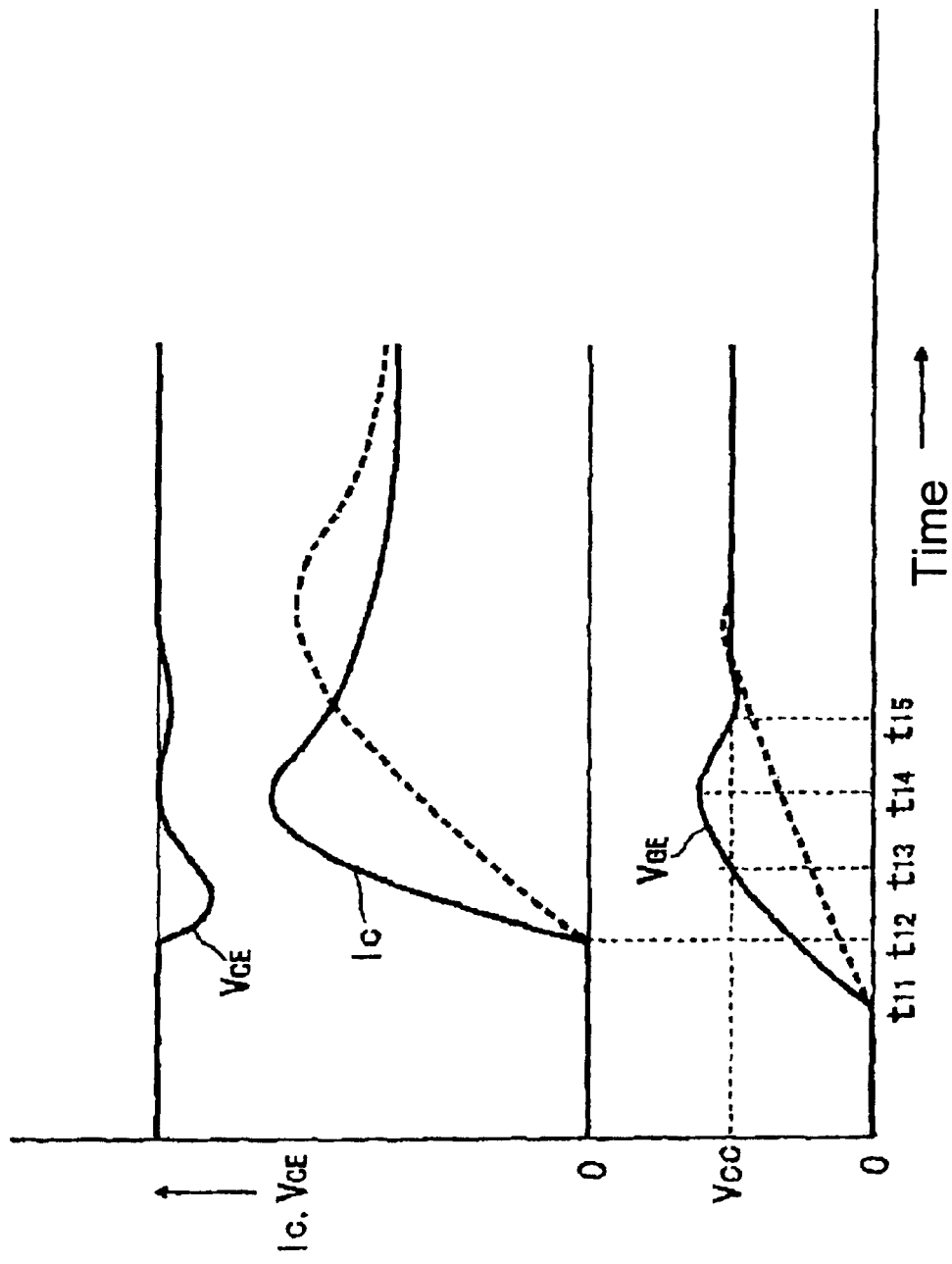
FIG. 9 is a waveform diagram showing voltage and current waveforms observed during a turn-on period in a load short circuit state of an IGBT.

Next, the turn-on of the IGBT 1 in the case of a load short circuit will be considered. In a load short circuit, since the Miller effect of the IGBT 1 eliminates the area in which the gate potential $V_{GE}$ of the IGBT 1 is constant, the MOSFET 2 is constantly subjected to the Miller effect. Thus, the gate potential of the MOSFET 2, that is, the ON resistance thereof, falls slowly to suppress the speed at which the gate voltage $V_{GE}$ of the IGBT 1 rises, as shown by the broken line in FIG. 9. Accordingly, the speed at which the collector current Ic rises is also restrained, as shown by the broken line in FIG. 9, thereby facilitating short-circuit protection.

Figure 2:
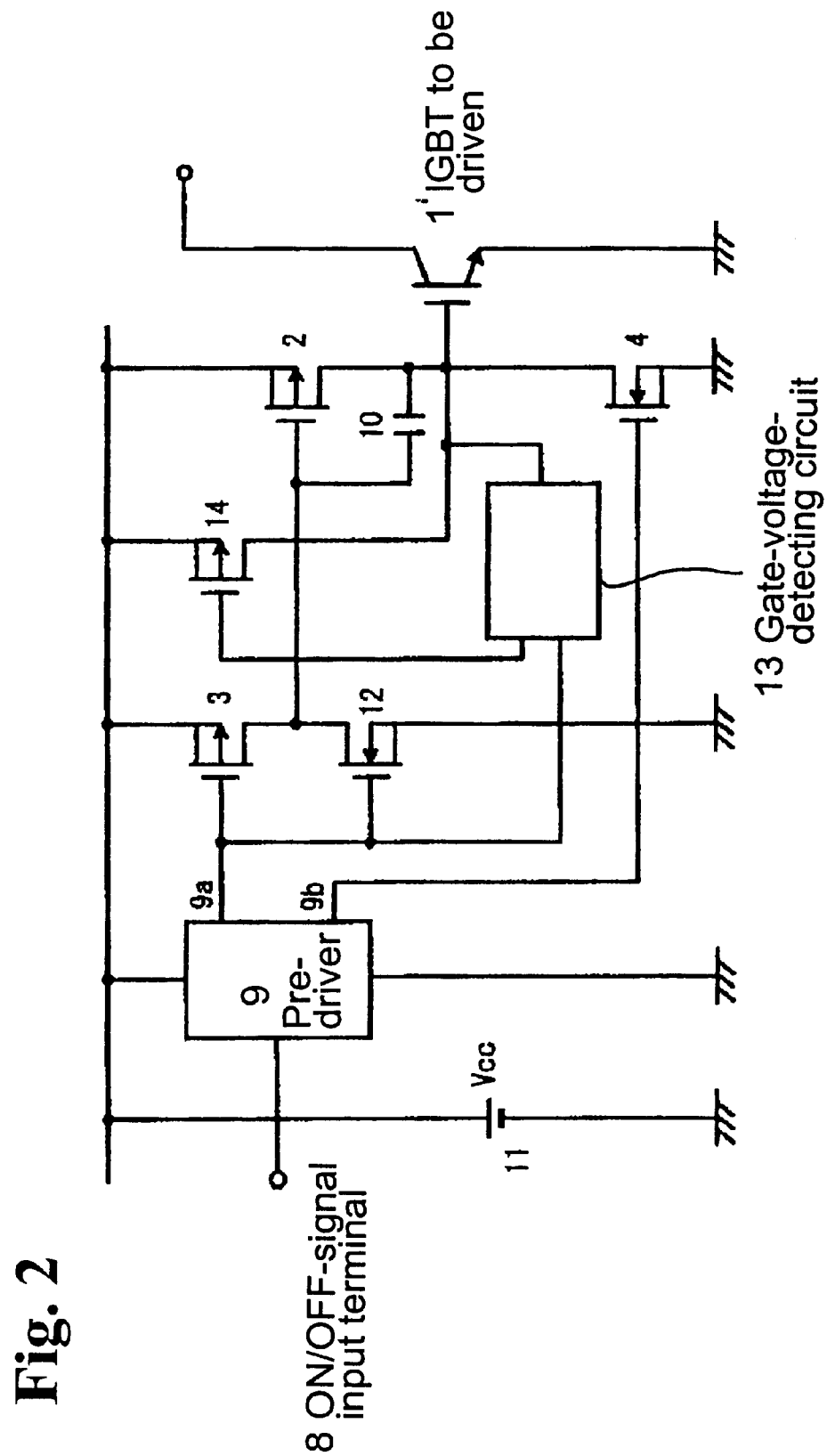
FIG. 2 is a configuration diagram of a drive circuit as a second embodiment of the present invention.

FIG. 2 is a circuit diagram showing a second embodiment of the present invention. This figure differs from FIG. 1 in that (1) this circuit has a MOSFET 12, instead of the MOSFET 5 with the resistor 6 omitted, and that (2) this circuit also has a gate-voltage-detecting circuit 13 for detecting the gate voltage $V_{GE}$ of the IGBT 1 and a MOSFET 14 controlled thereby.

The MOSFET 12 has a smaller W/L ratio (channel width/channel length) and a higher ON resistance than the MOSFET 5, thereby eliminating the resistor 6.

Thus, the difference (1) simply corresponds to the same effect realized by a different method. In the circuit shown in FIG. 2, however, an area in which the gate voltage of the MOSFET 2 is high corresponds to a constant-current area of the MOSFET 12, where the gate of the MOSFET 2 is discharged by means of a constant current, whereas an area in which the gate voltage of the MOSFET 2 is low corresponds to a resistance area thereof, where the gate discharge current through the MOSFET 2 decreases. In this respect, this circuit differs slightly from that shown in FIG. 1 in characteristics, but its basic operation is the same. This is also true if the gate of the MOSFET 2 is discharged by means of a constant-current source instead of the MOSFET 12.

The point (2), a substantial change point, will be described next. The circuit shown in FIG. 2 compensates for the disadvantage that an extended period of time is required for the gate voltage $V_{GE}$ of the IGBT 1 to reach the gate threshold value. The-gate-voltage-detecting circuit 13 turns the MOSFET 14 on using the "H" signal 9a from the predriver 9. Furthermore, the gate voltage $V_{GE}$ of the IGBT 1 is detected so that the MOSFET 14 is turned off when the gate voltage $V_{GE}$ reaches the gate threshold value. Thus, the gate of the IGBT 1 is rapidly charged until the gate voltage $V_{GE}$ of the IGBT 1 reaches the gate threshold value, and the circuit subsequently performs the same operations shown in FIG. 1.

Figure 3:
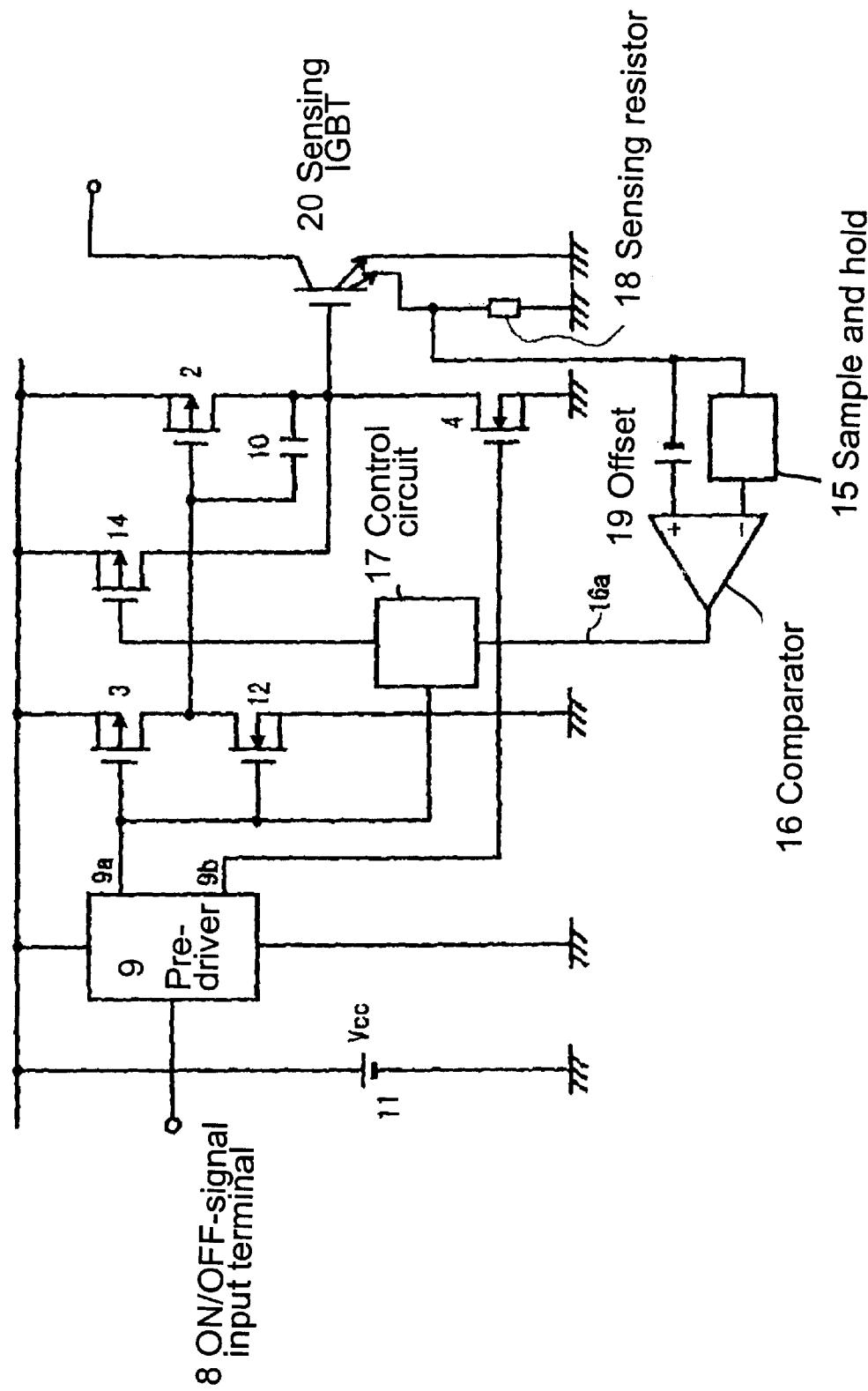
FIG. 3 is a configuration diagram of a drive circuit as a third embodiment of the present invention.

The fact that the gate voltage $V_{GE}$ of the IGBT 1 has reached its threshold value can be detected through the use of a sensing IGBT 20 or the like, such as that shown in FIG. 3, in the IGBT 1, instead of the gate-voltage-detecting circuit 13, to detect that the collector current has started to flow in the IGBT. In addition, the gate of the IGBT 1 can be rapidly charged by using, instead of the configuration shown in FIG. 2, a second supply separate from the supply 11, which has a voltage lower than the gate threshold value to charge the gate of the IGBT 1 during the earlier half of the turn-on period (between time t1 and t2 shown in FIG. 6). In this case, when the gate voltage $V_{GE}$ of the IGBT 1 reaches its threshold value, the charging stops automatically to eliminate the need for turn-off control.

The configuration shown in FIG. 2 can reduce losses in the IGBT 1 without increasing radiation noise and can preclude an increase in the delay time before the start of the turn-on of the IGBT 1 (start of conduction), that is, an increase in the storage time, to prevent control ability from being degraded.

FIG. 3 is a circuit diagram that shows a third embodiment of the present invention and differs from FIG. 2 in that the voltage-detecting circuit 13 is omitted, in that this circuit has a sensing IGBT 20 instead of the IGBT 1', having a separated emitter electrode in order to sense the collector current, a sensing resistor 18 being connected between a sensing terminal and the main emitter terminal of the sensing IGBT 20, and in that this circuit additionally has a sample-and-hold circuit 15 for holding a voltage drop in the sensing resistor 18, a comparator 16 for comparing a sampled and held value as an output from the sample-and-hold circuit 15 with a voltage drop in the sensing resistor 18, and a control circuit 17 for controlling the gate of the MOSFET 14 based on the output 16a from the comparator 16 and the output 9a from the predriver 9.

The operation of the circuit shown in FIG. 3 will be described below with reference to FIGS. 5 and 6. In FIGS. 1 and 2, the speed at which the gate voltage $V_{GE}$ of the IGBT increases is diminished between time t2 and t3 shown in FIG. 6, but a reduction in the speed at which the gate voltage $V_{GE}$ rises (or falls) is actually required during the period between time t3 and t5.

This is due to the fact that a current flowing through the IGBT during reverse recovery of the free-wheeling diode 31 originates from an overshoot of the gate voltage $V_{GE}$ of the IGBT. Thus, the speed at which the gate voltage $V_{GE}$ of the IGBT increases need not be restrained during the period between time t2 and t3 shown in FIG. 6, whereas a decrease in the di/dt of the collector current flowing through the IGBT may increase turn-on losses.

Since, however, an actual PWM inverter produces a current with approximate a sine waveform, the output current from the inverter varies from zero to the rated value or higher. Even if the inverter output current is close to zero, a collector current based on the junction capacity of the free-wheeling diode flows through the IGBT, and the speed at which the gate voltage $V_{GE}$ of the IGBT increases must initially be reduced. If, however, the inverter output current is not zero, the speed at which the gate voltage $V_{GE}$ of the IGBT increases must be reduced when all currents flowing through the free-wheeling diode 31 have been commuted to the IGBT.

The current flowing through the free-wheeling diode 31 must be detected before it can be predicted when time t3 shown in FIG. 6 ends. In the circuit shown in FIG. 3, control is made based on the fact that the current flowing through the free-wheeling diode 31 is virtually the same as that flowing though the IGBT during the last turn-on period.

After time t5 shown in FIG. 6, once the collector current Ic has become substantially constant, the sample-and-hold circuit 15 uses a pulse-generating circuit (not shown) to load and hold the value of the current flowing through the IGBT as a voltage drop in the sensing resistor 18. The comparator 16 uses the next turn-on timing to detect the current flowing through the IGBT 20, and compares it with the output from the sample-and-hold circuit 15 to detect that all currents flowing through the free-wheeling diode 31 have been commuted to the IGBT 20. The comparator 16 then transmits a signal to the control circuit 17.

The control circuit 17 turns on the MOSFET 14 in response to "H" output 9a from the predriver 9 (ON signal), and then turns off the MOSFET 14 in response to an output 16a from the comparator 16.

An offset 19 indicated by a battery symbol and connected to a (+) input of the comparator 16 serves to reverse the output 16a from the comparator 16 earlier, that is, the collector current flowing through the sensing IGBT 20 is lower than the value held in the sample-and-hold circuit 15, while considering a delay in the comparator 16, the control circuit 17, or the like.

The offset 19 can be implemented by various methods, such as addition as a circuit element or variation of the ratio of the channel length to the channel width of a MOSFET device (not shown) in an input section in the comparator 16.

Thus, the method shown in FIG. 3 can prevent increases in the radiated noise and further reduce turn-on losses in the IGBT.

According to the invention described in the first aspect, the capacitor is inserted between the gate and drain of the MOSFET used to charge the control terminal of the semiconductor switching device to be driven (which will be referred to as a "main power device" hereinafter for the sake of convenience) in order to turn on the device.

Thus, a larger Miller effect can be obtained if the drain voltage of the MOSFET for charging the control terminal (that is, the voltage at the control terminal of the main power device) varies during the turn-on period of the main power device. Consequently, in an area in which the voltage at the control terminal of the main power device rises (or falls) rapidly, the ON resistance of the control-terminal-charging MOSFET decreases at a reduced (or increased) speed. The speed at which the voltage at the control terminal of the main power device varies, and thus the di/dt of the current flowing through the main power device between time t2 and t5 shown in FIG. 6 and the dV/dt measured at the beginning of the decline in the collector-emitter voltage are maintained at small values to restrain the current peak and thus noise. Furthermore, the speed at which the current increases is reduced during the turn-on period if the load on the main power device is short circuited, thereby allowing the protection circuit to protect the main power device easily.

On the contrary, in the area in which the voltage at the control terminal of the main power device varies slowly, the Miller effect does not operate and the ON resistance of the control-terminal-charging MOSFET falls at an increased speed to shorten the period between time t5 and t6 shown in FIG. 6, in order to lessen losses during the latter half of the turn-on period.

According to the invention described in the second to fifth aspects, in the invention described in the first aspect, the means for relatively slowly charging the gate of the control-terminal-charging MOSFET is provided to improve the effect of diminishing the di/dt and dV/dt of the main power device.

The means is separately provided for rapidly charging the control terminal of the main power device during the period between the input of the ON signal and the start of the flow of a current through the main power device, thereby preventing a delay in turn-on in the implementation of the invention described in the first to fifth aspects.

According to the invention in the seventh aspect, in the invention in the first to fifth aspects, the means is separately provided for rapidly charging the control terminal of the main power device during the period between the input of the ON signal and time t3 shown in FIG. 6 (commutation completion time), when all currents flowing through the free-wheeling diode connected in series with the main power device have been commuted to the main power device, thereby preventing, in the implementation of the invention in the first to fifth aspects, the former half (period between time t2 and t3 shown in FIG. 6) of the turn-on period from being extended to increase losses during this period.

According to the invention in the eighth aspect, in the invention in the seventh aspect, the means for sampling and holding the last current flowing through the main power device and the current-comparison means for comparing the sampled and held current value with the present current flowing through the voltage-controlled semiconductor switching device are provided as means for detecting the commutation completion time. Consequently, when used in an inverter circuit wherein the main power device conducts a sinusoidal current while a motor is subjected to a PWM control, the present invention can constantly detect the commutation completion time, even if the current level of the main power device varies significantly.

According to the invention in the ninth aspect, in the invention in the eighth aspect, the offset is added to the current-comparison means in order to prevent a delay in completion of the rapid charging of the control terminal of the main power device, based on the means for detecting the commutation completion time or another means.

While the invention is explained with reference to the specific embodiments of the invention, the explanation is illustrative and the invention is limited only by the appended claims.

What is claimed is:

1. A drive circuit for driving a voltage-controlled semiconductor switching device with a control terminal, comprising:

means for supplying a current to the control terminal based on an input of an ON signal in one switching term of the switching device, said current-supplying means including a voltage-controlled transistor having a gate electrode and a drain electrode connected to the control terminal, a capacitor connected between the gate and drain electrodes of the voltage-controlled transistor, and slow-charging means for relatively slowly charging the gate of the voltage-controlled transistor based on the input of the ON signal in said one switching term so that di/dt at a time of rising of a collector current of the semiconductor switching device and dV/dt at a beginning of a decline in a collector-emitter voltage of the semiconductor switching device are maintained at low values, Miller effect does not operate in an area in which a voltage between a collector and an emitter of the semiconductor switching device changes slowly, and an ON resistance of the voltage-controlled transistor falls at an increased speed, and means for removing a current from the control terminal of the voltage-controlled semiconductor switching device based on an input of an OFF signal, said current removing means being connected to the control terminal.

2. A drive circuit according to claim 1, wherein said slow-charging means comprises a constant-current source.

3. A drive circuit according to claim 1, wherein said current-supplying means further includes means for rapidly charging to the control terminal of the voltage-controlled semiconductor switching device during a period between the input of said ON signal and a start of a flow of a current through said voltage-controlled semiconductor switching device in said one switching term, said rapid charging being switched to the slow charging at a time of said start of the flow of the current, said charging means being connected to the control terminal.

4. A drive circuit according to claim 1, wherein said voltage-controlled switching device is switched on and off repeatedly, said one switching term including one turn-on time and one turn-off time in repeated on-off switchings of the switching device.

5. A drive circuit for driving a voltage-controlled semiconductor switching device with a control terminal, comprising:

means for supplying a current to the control terminal based on an input of an ON signal in one switching term of the switching device, said current-supplying means including a voltage-controlled transistor having a gate electrode and a drain electrode connected to the control terminal, a capacitor connected between the gate and drain electrodes of the voltage-controlled transistor, slow-charging means for relatively slowly charging the gate of the voltage-controlled transistor based on the input of the ON signal in said one switching term to thereby control rising of a collector current of the semiconductor switching device, means for detecting a commutation completion point when all currents through a free-wheeling diode connected in series with said voltage-controlled semiconductor switching device has been commuted to the voltage-controlled semiconductor switching device, and means for rapidly charging to the control terminal of said voltage-controlled semiconductor switching device during a period between the input of the ON signal and the commutation completion point in said one switching term, rapid charging being switched to the slow charging at a time of the commutation completion point, said charging means being connected to the detecting means and the control terminal, and means for removing a current from the control terminal of the voltage-controlled semiconductor switching device based on an input of an OFF signal, said current removing means being connected to the control terminal.

6. A drive circuit for driving a voltage-controlled semiconductor switching device with a control terminal, comprising:

means for supplying a current to the control terminal based on an input of an ON signal, said current-supplying means including a voltage-controlled transistor having a gate electrode and a drain electrode connected to the control terminal, a capacitor connected between the gate and drain electrodes of the voltage-controlled transistor, and slow-charging means for relatively slowly charging the gate of the voltage-controlled transistor based on the input of the ON signal, said slow-charging means including a semiconductor switching device and a resistor connected in series therewith, and means for removing a current from the control terminal of the voltage-controlled semiconductor switching device based on an input of an OFF signal, said current removing means being connected to the control terminal.

7. A drive circuit for driving a voltage-controlled semiconductor switching device with a control terminal, comprising:

means for supplying a current to the control terminal based on an input of an ON signal, said current-supplying means including a voltage-controlled transistor having a gate electrode and a drain electrode connected to the control terminal, a capacitor connected between the gate and drain electrodes of the voltage-controlled transistor, and slow-charging means for relatively slowly charging the gate electrode of the voltage-controlled transistor based on the input of the ON signal, said slow-charging means including two semiconductor switching devices and a resistor connected between the two semiconductor switching devices, one side of the resistor being connected to the gate electrode of the voltage-controlled transistor, and means for removing a current from the control terminal of the voltage-controlled semiconductor switching device based on an input of an OFF signal, said current removing means being connected to the control terminal.

8. A drive circuit for driving a voltage-controlled semiconductor switching device with a control terminal, comprising:

means for supplying a current to the control terminal based on an input of an ON signal, said current-supplying means including a voltage-controlled transistor having a gate electrode and a drain electrode connected to the control terminal, a capacitor connected between the gate and drain electrodes of the voltage-controlled transistor, means for detecting a commutation completion point when all currents through a free-wheeling diode connected in series with said voltage-controlled semiconductor switching device has been commuted to the voltage-controlled semiconductor switching device, and means for rapidly charging to the control terminal of said voltage-controlled semiconductor switching device during a period between the input of the ON signal and the commutation completion point, said charging means being connected to the detecting means and the control terminal, said means for detecting the commutation completion point having means for sampling and holding the current flowing through said voltage-controlled semiconductor switching device, and current comparison means connected to the sampling and holding means for comparing sampled and held current value with a current presently flowing through the voltage-controlled semiconductor switching device, and means for removing a current from the control terminal of the voltage-controlled semiconductor switching device based on an input of an OFF signal, said current removing means being connected to the control terminal.

9. A drive circuit according to claim 8, wherein said current comparison means adds a predetermined offset to the compared current value to enable earlier detection of the commutation completion point.

* * * * *

UNITED STATES PATENT AND TRADEMARK OFFICE
CERTIFICATE OF CORRECTION

PATENT NO. : 6,570,413 B1  Page 1 of 1
DATED : May 27, 2003
INVENTOR(S) : Naoki Kumagai et al.

It is certified that error appears in the above-identified patent and that said Letters Patent is hereby corrected as shown below:

<u>Column 3,</u>
Line 2, change "Ii" to -- I1 --;

<u>Column 4,</u>
Line 2, change "ti" to -- t1 --;
Line 11, change "the-actual" to -- the actual --; and <u>Column 10,</u>
Line 15, change "The-gate" to -- The gate --.

Signed and Sealed this

Twenty-third Day of September, 2003

JAMES E. ROGAN
*Director of the United States Patent and Trademark Office*